United States Patent
Lam et al.

(10) Patent No.: US 10,353,457 B1
(45) Date of Patent: Jul. 16, 2019

(54) SYSTEMS AND METHODS FOR SLEEP MODE POWER SAVINGS IN INTEGRATED CIRCUIT DEVICES

(71) Applicant: ALTERA CORPORATION, San Jose, CA (US)

(72) Inventors: Kuan Woei Lam, Bayan Lepas (MY); Kok Kee Looi, Permatang Pauh (MY)

(73) Assignee: Altera Corporation, San Jose, CA (US)

(*) Notice: Subject to any disclaimer, the term of this patent is extended or adjusted under 35 U.S.C. 154(b) by 150 days.

(21) Appl. No.: 14/638,879

(22) Filed: Mar. 4, 2015

(51) Int. Cl.
| | |
|---|---|
| G06F 1/00 | (2006.01) |
| G06F 1/26 | (2006.01) |
| G06F 1/32 | (2019.01) |
| G06F 1/3296 | (2019.01) |
| H03K 19/177 | (2006.01) |

(52) U.S. Cl.
CPC ......... *G06F 1/3296* (2013.01); *H03K 19/177* (2013.01)

(58) Field of Classification Search
CPC .................................................... G06F 1/32
See application file for complete search history.

(56) References Cited

U.S. PATENT DOCUMENTS

| | | | | |
|---|---|---|---|---|
| 4,463,354 A | * | 7/1984 | Sears ..................... | G01D 4/006 324/157 |
| 5,432,462 A | | 7/1995 | Obregón et al. | |
| 5,883,528 A | * | 3/1999 | Kashmiri ......... | H03K 19/01858 326/34 |
| 5,958,026 A | | 9/1999 | Goetting et al. | |
| 6,101,144 A | | 8/2000 | Jo | |
| 6,549,471 B1 | * | 4/2003 | Zivanovic ............ | G11C 7/1051 365/189.05 |
| 6,816,977 B2 | * | 11/2004 | Brakmo ................ | G06F 1/3203 713/300 |
| 7,007,175 B2 | | 2/2006 | Chang et al. | |
| 7,080,341 B2 | | 7/2006 | Eisenstadt et al. | |
| 7,098,689 B1 | | 8/2006 | Tuan et al. | |
| 7,498,835 B1 | | 3/2009 | Rahman et al. | |
| 7,558,143 B1 | | 7/2009 | Law et al. | |
| 7,714,610 B2 | | 5/2010 | He | |
| 7,791,978 B2 | | 9/2010 | Bartley et al. | |
| 8,104,012 B1 | | 1/2012 | Klein et al. | |
| 8,339,891 B2 | | 12/2012 | Arntzen et al. | |
| 9,383,808 B2 | * | 7/2016 | Wakrat .................. | G06F 1/3203 |
| 9,680,773 B1 | * | 6/2017 | Tan ..................... | H04L 49/9005 |

(Continued)

*Primary Examiner* — Mohammed H Rehman
(74) *Attorney, Agent, or Firm* — Fletcher Yoder, P.C.

(57) ABSTRACT

Embodiments of the disclosure relate to systems and methods to reduce power consumption in an integrated circuit (IC) device by controlling various power consuming components of the IC device to a sleep mode when the power consuming components are not in use. The reduction in power consumption by the various power consuming components may reduce power consumption of the IC device in general. In one example, the IC device may include power consuming buffers of data input paths, data output paths, address pin paths, and a clock output path. The IC device may instruct one or more of the power consuming buffers to enter a sleep mode when functions of the one or more power consuming buffers are not in use. In this manner, the IC device may save power while performing various operations (e.g., read/write operations and memory refresh operations).

20 Claims, 6 Drawing Sheets

(56) References Cited

U.S. PATENT DOCUMENTS

| | | | |
|---|---|---|---|
| 2003/0105983 A1* | 6/2003 | Brakmo | G06F 1/3203 713/320 |
| 2004/0003162 A1* | 1/2004 | Chan | G06F 13/4068 710/305 |
| 2004/0205426 A1* | 10/2004 | Muranaka | G06F 11/1008 714/704 |
| 2007/0297441 A1* | 12/2007 | Heil | H04L 12/4035 370/460 |
| 2009/0245007 A1* | 10/2009 | Kaburlasos | G11C 5/143 365/226 |
| 2010/0156458 A1 | 6/2010 | Speers | |
| 2011/0176466 A1* | 7/2011 | Lindoff | H04W 52/0238 370/311 |
| 2011/0239256 A1* | 9/2011 | Gholmieh | H04W 72/005 725/62 |
| 2013/0114413 A1* | 5/2013 | Song | H04L 49/9042 370/237 |
| 2013/0243007 A1* | 9/2013 | Ding | H04L 47/58 370/412 |
| 2013/0339775 A1* | 12/2013 | Shaeffer | G11C 7/1072 713/323 |
| 2014/0247788 A1* | 9/2014 | Kim | H04W 68/025 370/329 |
| 2015/0043481 A1* | 2/2015 | Mucke | H04L 1/1854 370/329 |
| 2016/0197817 A1* | 7/2016 | Hayashitani | H04B 10/27 398/58 |

\* cited by examiner

SYSTEMS AND METHODS FOR SLEEP MODE POWER SAVINGS IN INTEGRATED CIRCUIT DEVICES

BACKGROUND

This disclosure relates generally to integrated circuit devices and, more particularly, to reducing power consumption in integrated circuit devices by enabling certain power-consuming components of the integrated circuit device to enter a sleep mode while not in use.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Integrated circuits are found in a variety of electronic systems. Computers, handheld devices, portable phones, televisions, industrial control systems, and robotics, to name just a few, rely on integrated circuits. For example, an integrated circuit, such as a programmable logic device (PLD) (e.g., a field programmable gate array (FPGA)) or an application-specific integrated circuit (ASIC), may interact with memory devices, such as dynamic random access memory (DRAM), to carry out certain data processing. As an increasing number of electronic systems rely on integrated circuits, it becomes increasingly valuable to reduce the amount of power consumed by those integrated circuits.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of this disclosure relate to systems and methods for reducing power consumption in an integrated circuit (IC) device by controlling various power consuming components of the IC device to a sleep mode when the power consuming components are not in use. The reduction in power consumption by the various power consuming components may reduce power consumption of the IC device in general. In one example, the IC device may include power consuming buffers of data input paths, data output paths, address pin paths, and a clock output path. The IC device may instruct one or more of the power consuming buffers to enter a sleep mode when functions of the one or more power consuming buffers are not in use. In this manner, the IC device may save power while performing various operations (e.g., read/write operations and memory refresh operations).

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present invention alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of this disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of this disclosure are not intended to be interpreted as excluding the existence of additional embodiments that also incorporate the recited features.

This disclosure generally relates to integrated circuit devices with embedded programmable logic that enables reducing power consumption in the integrated circuit devices. In particular, the integrated circuit devices may include components that consume power while not in use for certain operations of the integrated circuits. These power consuming components may include buffers for data input and output pins, buffers for output address pins, and buffers for clock pins. To reduce power consumption by the integrated circuit device, the integrated circuit device may control the buffers to a sleep mode when the buffers are not in use during the specific operations. While in the sleep mode, the power consumption of the buffers may be reduced.

Figure 1:
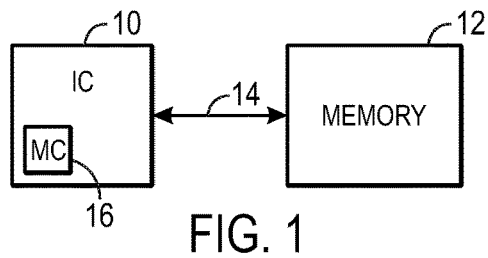
FIG. 1 is a block diagram of a system including an integrated circuit device and a memory device, in accordance with an embodiment.

With this in mind, FIG. 1 is a block diagram of a system including an integrated circuit (IC) device 10 that may use buffer sleep modes to reduce power consumption and a memory device 12 that the IC device 10 may read data from and write data to. The host memory device 12 may be any memory device, such as a dynamic random access memory (DRAM), which is capable of communicating with the IC device 10 via a communication path 14. The communication path 14 may include busses communicatively coupled to pins of the IC device 10 and the memory device 12. Further, the busses making up the communication path 14 may provide data read, data write, and address paths between the IC device 10 and the memory device 12. Furthermore, the IC device 10 may be a wide variety of integrated circuits, such as field-programmable gate arrays (FPGA), application-specific integrated circuits (ASIC), system on a chip (SoC), transceivers (e.g., optical module), memory modules and the like. As such, the IC device 10 may represent a programmable logic device (PLD), such as those available by Altera Corporation of San Jose, Calif.

Additionally, the IC device 10 may include a memory controller 16, which is also labeled as MC within the IC device 10 of FIG. 1. The memory controller 16 may provide instructions to the IC device 10 for controlling operations of some portions of the IC device 10, as described in greater detail below. In some instances, the memory controller 16 of the IC device 10 may provide timing for performing the read and write operations via the communication path 14.

Further, the IC device 10 may enable a designer to create a customized design capable of executing and performing customized functions on the IC device 10. Each design may have its own hardware implementation to be implemented on the IC device 10. For instance, a specific hardware implementation may establish the sleep mode function of the IC device 10.

Figure 2:
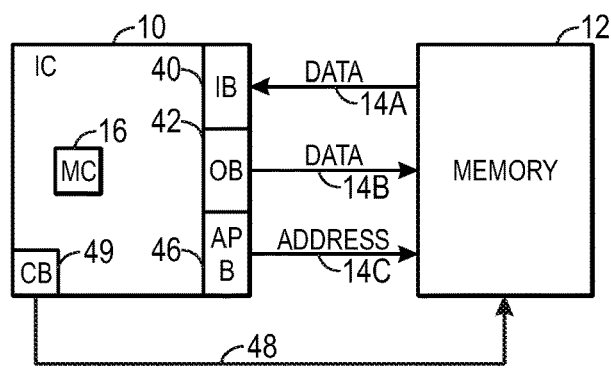
FIG. 2 is a block diagram of the system of FIG. 1 including data buffers, an address pin buffer, and a clock buffer of the integrated circuit device, in accordance with an embodiment.

Referring now to FIG. 2, a block diagram of a system including the IC device 10 and the memory device 12 is illustrated. Further, FIG. 2 includes various communication paths 14A-14C and an input buffer 40, an output buffer 42, an address pin buffer 46, a clock signal 48, and a clock buffer 49. Each of the buffers 40, 42, 46, and 49 may be associated with an input/output pin of the IC device 10. The IC device 10 may receive data from the memory device 12 via the data communication path 14A. The data may enter IC device 10 at the input buffer 40 during a read operation of the IC device 10. For example, the memory device 12 may provide the data to the IC device 10 over the communication path 14A when the IC device 10 issues a read command to the memory device 12. Further, the input buffer 40 may provide a link between the IC device 10 and the communication path 14A.

Additionally, the IC device 10 may provide data to the memory device 12 via the data communication path 14B after manipulation of data previously received from the memory device 12 during a read operation or data received by the IC device 10 from elsewhere. For example, the data may exit programmable logic of the IC device 10 and enter the output buffer 42 upon the IC device 10 issuing a write command. The output buffer 42 may provide a link between the IC device 10 and the communication path 14B for transmission of the data to the memory device 12.

Further, the IC device 10 may also determine address information for the memory device 12 to provide a location where to read data from the memory device 12 and to provide a location where to write the data on the memory device 12. For example, the communication path 14C may provide address output information from the IC device 10 to the memory device 12. The address pin buffer 46 may provide a link between address data provided by the IC device 10 and the communication path 14C. Furthermore, the clock buffer 49 may also provide a link from the IC device 10 for the clock signal 48.

Figure 3:
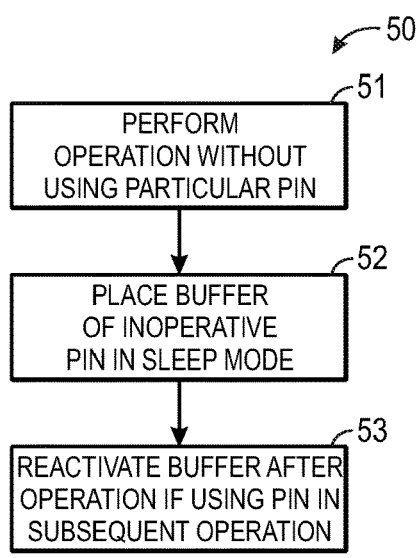
FIG. 3 is a flowchart of a method for reducing power consumption in the integrated circuit device, in accordance with an embodiment.

As mentioned above, not all of the buffers 40, 42, 46, and 49 are used during every operation of the IC device 10. However, the buffers 40, 42, 46, and 49 may continue to consume power even while not in use. Accordingly, FIG. 3 provides a method 50 for reducing power consumption in the IC device 10. More particularly, the method 50 describes controlling the buffers 40, 42, 46, and 49 to a sleep mode while their respective input/output pins of the IC device 10 are not in use.

Initially, the IC device 10 may perform an operation without using a particular input/output pin (block 51). For example, when a read operation is performed by the IC device 10, the IC device 10 does not use the output buffer 42 assigned to write data to the communication path 14B. Accordingly, the output buffer 42 for writing data is not used during the read operation.

Subsequently, upon determining which of the input/output buffers are not in use, the memory controller 16 of the IC device 10 may control the buffers 40, 42, 46, and/or 49 associated with the pins not in use to enter the sleep mode (block 52). The sleep mode may, for example, involve removing the unused buffers from the power source. Because the buffers may draw power even while not in actual use, power consumption may be reduced by instructing the buffers 40, 42, 46, and/or 49 to the sleep mode. In the read operation example above, the output buffer 42 may be controlled by the memory controller 16 to enter the sleep mode and, thereby, avoid excess power consumption by the IC device 10.

Upon completion of the operation, the IC device 10 may reactivate the buffer 40, 42, 46, or 49 in the sleep mode upon determining if the respective input/output pin will be used in a directly subsequent operation (block 53). There may be a latency cost in instructing the buffers 40, 42, 46, and 49 to enter the sleep mode or exit the sleep mode. Accordingly, the IC device 10 may look ahead to future operations to determine at which point the buffers 40, 42, 46, and 49 should exit the sleep mode. In particular, the memory controller 16 may instruct the buffers 40, 42, 46, and 49 to exit the sleep mode at a certain number of clock cycles prior to the buffers 40, 42, 46, and 49 being used for the next operation. Accordingly, in some situations, the time for the buffer to enter the sleep mode and the time to exit the sleep mode may be longer than an operation performed by the IC device 10. In such a situation, the memory controller 16 may not instruct the buffer to enter the sleep mode, but, instead, the buffer may remain active throughout the operation in which the buffer is not used. Additionally, the certain number of clock cycles may depend on a specific configuration of the IC device 10 and the latency cost of waking the buffers 40, 42, 46, and 49 from the sleep mode.

Figure 4:
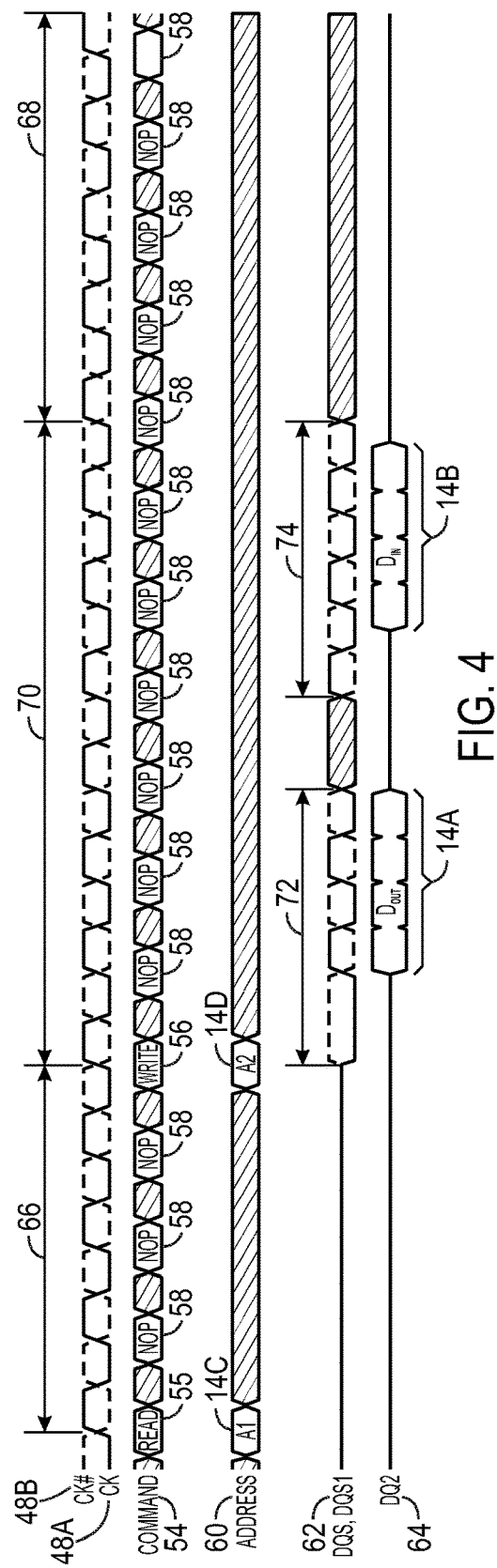
FIG. 4 is a timing diagram of the integrated circuit device including a data read and a data write operation, in accordance with an embodiment.

To help illustrate when the particular input/output pins are idle and, thus, their respective buffers 40, 42, 46, and 49 are available to enter the sleep mode, FIG. 4 is a timing diagram for a command line 54 including a read command 55 and a write command 56. Also included on the command line are no process indicators 58. The no process indicators 58 indicate clock cycles during which the IC device 10 does not issue a command to the memory device 12. For example, as illustrated in FIG. 4, the IC device 10 issues the read command 55 and the write command 56, but the remainder clock cycles of the timing diagram include the no process indicators 58. Accordingly, the illustrated time window of the timing diagram does not indicate any additional commands from the IC device 10. Further, to help illustrate timing of the time diagram, the clock cycle is represented by line 48A, and the inverse clock cycle is represented by line 48B.

Also included is an address line 60. The address line 60 may provide an address indication A1 for reading the data from the memory device 12 via the communication path 14C. Additionally, the address line 60 may provide an address indication A2 for writing the data to the memory device 12 via the communication path 14C after the data is processed by the IC device 10. Further, the timing diagram includes data lines DQS 62 and DQ 64. The DQS data line 62 represents a strobe signal supplied to a DQS bus of the memory device 12 to help synchronize data provided by the DQ data line 64 to the memory device 12 when the memory device 12 does not share a common clock with the IC device 10. Accordingly, there may be a latency cost associated with synchronizing the memory device 12 prior to the data read operations and the data write operations occurring. Because the data input/output pins are used only during the read and write operations, the input and output buffers 40 and 42 may be idle during the time periods 66 and 68.

In contrast, at least one of the input and output buffers may be active during the time period 70, which includes both the read and write operations. For example, the read command 55 is issued by the IC device 10 four clock cycles prior to a start of a period 72, which represents operation of the read command 55 by the IC device 10. Additionally, the write command 56 is issued by the IC device 10 four clock cycles prior to a start of a period 74, which represents operation of the write command 56 by the IC device 10. The DQ data line 64 provides an indication of when the data is read from the communication path 14A (indicated by $D_{OUT}$) and written to the communication path 14B (indicated by $D_{IN}$). In the illustrated embodiment, the data is read from the communication path 14A by the IC device 10 one clock cycle after the input buffer 40 begins operation. Further, the data is written to the communication path 14B three-quarters of a clock cycle after the output buffer 42 begins operation.

Figure 5:
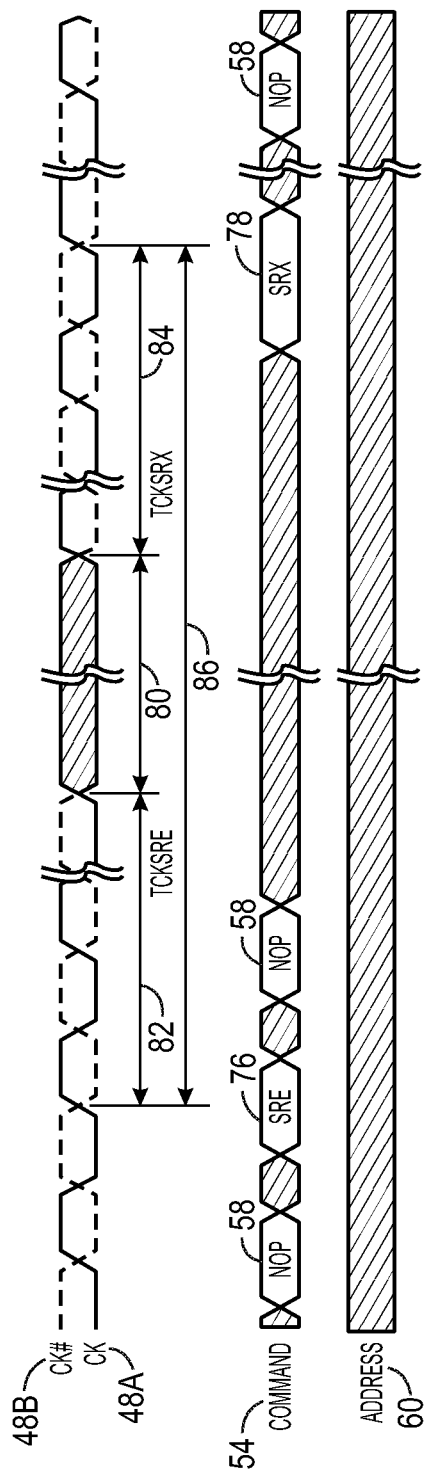
FIG. 5 is a timing diagram of the integrated circuit device including a self-refresh operation command for a dynamic random access memory (DRAM) coupled to the integrated circuit device, in accordance with an embodiment.

While FIG. 4 provided an indication of when the data input and output buffers 40 and 42 were eligible to enter the sleep mode, FIG. 5 provides a timing diagram of the IC device 10 including a self-refresh operation entry command 76 for the memory device 12 and a self-refresh operation exit command 78. Specifically, the illustrated embodiment includes a scenario where the memory device 12 is a dynamic random access memory (DRAM) device communicatively coupled to the IC device 10. In the illustrated embodiment, the IC device 10 may receive the self-refresh operation entry command 76 via the memory controller 16 prior to entering a self-refresh mode 80 at a beginning of a self-refresh entry period 82. The self-refresh entry period 82 represents a latency time for the IC device 10 to enter the self-refresh mode 80. Additionally, upon completion of the self-refresh mode 80, the IC device 10 may enter a self-refresh exit period 84. The self-refresh exit period 84 indicates a latency period for components of the IC device 10 and the memory controller 16 to reestablish standard operation of the IC device 10. A combination of the self-refresh mode 80, the self-refresh entry period 82, and the self-refresh exit period 84 make up a total self-refresh operation 86.

With this in mind, during the self-refresh mode 80, all of the buffers of the IC device 10 may enter the sleep mode to conserve power consumed by the IC device 10. For example, the self-refresh mode 80 may be entered when the IC device 10 is not using the memory device 12 for extended periods of time. In this situation, the IC device 10 may deactivate the clock signals 48A and 48B to conserve power consumed by the IC device 10. Further, refresh timing of the memory device 12 may be carried out by an internal refresh clock of the memory device 12 to maintain data on the memory device 12. Therefore, during long periods of time where the IC device 10 does not access the memory device 12, controlling the buffers 40, 42, 46, and 49 to the sleep mode enables decreased power consumption.

Figure 6:
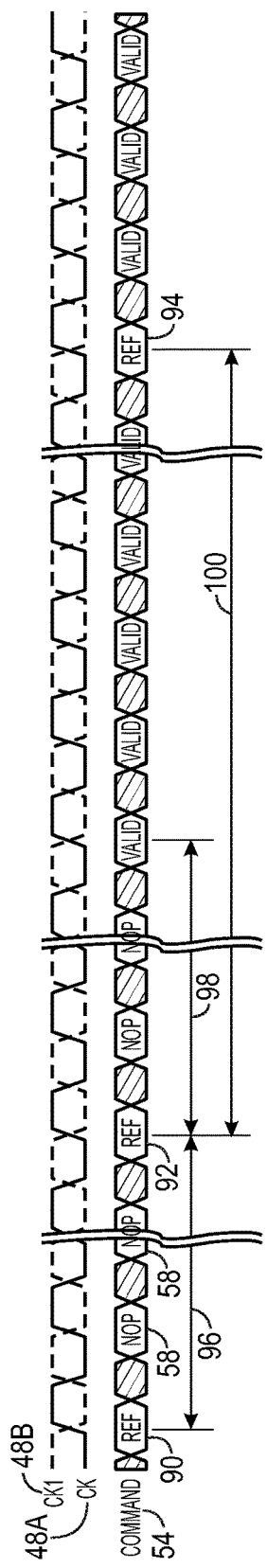
FIG. 6 is a timing diagram of the integrated circuit device including a refresh operation command for the DRAM coupled to the integrated circuit device, in accordance with an embodiment.

Similarly, FIG. 6 is a timing diagram of the IC device 10 including three refresh operation commands 90, 92, and 94 for the memory device 12 when the memory device 12 is a DRAM device coupled to the IC device 10. The three refresh operation commands 90, 92, and 94 indicate the periodic nature of the refresh operations. Periods 96 and 98 may represent the time between the refresh operation commands 90, 92, and 94 during which the buffers 40, 42, and 46 may operate in the sleep mode. For example, during the no process indicators 58 of the command line 54, the buffers 40, 42, and 46 may be in the sleep mode. However, upon receiving an operation command in the command line 54, indicated in FIG. 6 by the term "VALID," the buffers associated with the operation command may exit the sleep mode. Accordingly, period 100 represents a time between the refresh operation 92 and the refresh operation 94 during which the buffers 40, 42, and 46 may be in both the sleep mode and an operation mode for portions of the period 100. The refresh operation of FIG. 6 may be considered a type of auto-refresh to maintain data on the memory device 12 when the internal memory is a DRAM device. During either of the refresh periods 96 and 98, the IC device 10 may instruct the buffers 40, 42, and 46 to the sleep mode. In contrast to the self-refresh operation illustrated in FIG. 5, the refresh operation of FIG. 6 maintains operation of the clock cycles 48A and 48B and, thus, the clock buffer 49.

Figure 7:
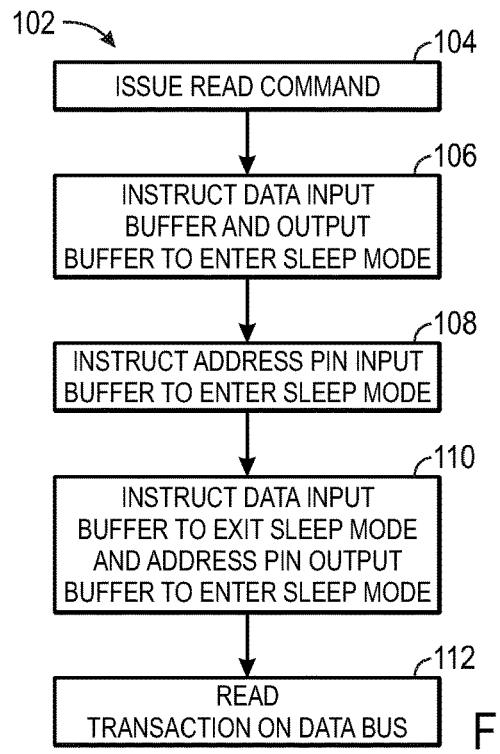
FIG. 7 is a flow chart of a method for reducing power consumption by the integrated circuit device during a read transaction, in accordance with an embodiment.
Figure 8:
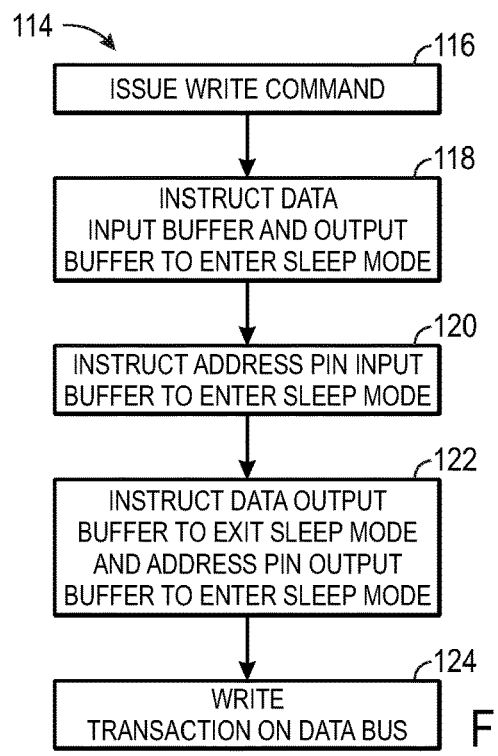
FIG. 8 is a flow chart of a method for reducing power consumption by the integrated circuit device during a write transaction, in accordance with an embodiment.
Figure 9:
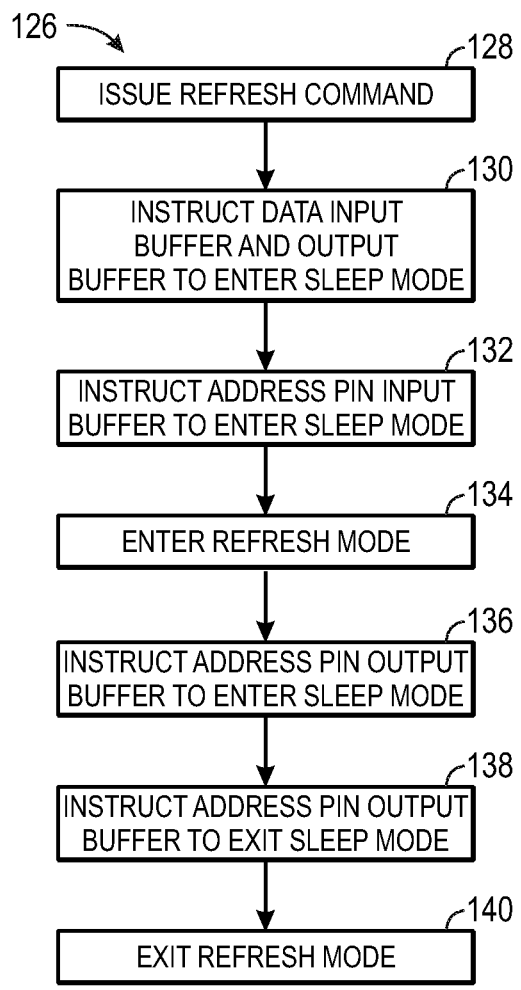
FIG. 9 is a flow chart of a method for reducing power consumption by the integrated circuit device during a DRAM refresh transaction, in accordance with an embodiment.

With the previously described commands in mind (e.g., read command, write command, self-refresh command, and refresh command), FIGS. 8-10 are flow charts for instructing various components of the IC device 10 to enter the sleep mode. For example, FIG. 7 is a flow chart of a method 102 for reducing power consumption by the IC device 10 when the IC device 10 issues the read command 55. Initially, the IC device 10 may issue the read command 55 (block 104). As discussed above, the read command 55 is issued by the IC device 10 to read data from the communication path 14A.

Upon issuing the read command 55, the IC device 10 may instruct the data input buffer 40 and the data output buffer 42 to enter the sleep mode (block 106). The data input buffer 40 may enter the sleep mode due to the latency period 66, as illustrated in FIG. 4, between issuing the read command 55 and performing the read operation. Additionally, because the read command 55 was issued by the IC device 10, the output buffer 42 of the IC device 10 may not operate at any time during the read operation. Accordingly, the output buffer 42 may remain in the sleep mode throughout the entire read operation.

Subsequently, after issuing the read command 55, the IC device 10 may instruct the address pin buffer 46 to enter the sleep mode (block 108). Because the IC device 10 only uses the address pin while issuing commands, the address pin buffer 46 may enter the sleep mode after the commands are issued by the IC device 10. Further, the address pin buffer 46 may remain in the sleep mode for the remainder of the data read operation.

After the latency period 66 ends, the IC device 10 may instruct the data input buffer 40 to exit the sleep mode, and the IC device 10 may again instruct the address pin buffer 46 to enter the sleep mode (110). Because the IC device 10 enters the read operation period 72, the data input buffer 40 becomes active to receive the data from the communication path 14A. Further, the address pin buffer 46 may not be used and enters the sleep mode.

Once the data input buffer 40 exits the sleep mode, the IC device 10 performs a read transaction on the communication path 14A (block 112). It may be appreciated that the communication paths 14A and 14B may also be referred to as data buses. As mentioned above, the data input buffer 40 provides the link for transmitting data between the communication path 14A and the IC device 10. Accordingly, the IC device 10 may read the data from the communication path 14A after the read latency period 66 ends, and after the input buffer 40 exits the sleep mode.

FIG. 8 is a flow chart of a method 114 for reducing power consumption by the IC device 10 when the IC device 10 issues the write command 56. Initially, the IC device 10 may issue the write command 56 (block 116). As discussed above, the write command 56 may instruct the IC device 10 to write data to the communication path 14B.

Upon issuing the write command 56, the IC device 10 may instruct the data input buffer 40 and the data output buffer 42 to enter sleep mode (block 118). The data output buffer 42 may enter the sleep mode due to a latency period of the write operation, as illustrated in FIG. 4, between issuing the write command 56 and performing the write operation. Additionally, because the write command 56 was issued by the IC device 10, an input pin of the IC device 10 may not operate at any time during a write operation process. Accordingly, the input buffer 40 may remain in the sleep mode throughout the entire write operation.

Subsequently, after issuing the write command 56, the IC device 10 may instruct the address pin buffer 46 to enter the sleep mode (block 120). Because the IC device 10 only uses the address pin while issuing commands, the address pin buffer 46 may enter the sleep mode after the commands are issued by the IC device 10. Further, the address pin buffer 46 may remain in the sleep mode for the remainder of the data write operation.

After the latency period ends, the IC device 10 may instruct the data output buffer 42 to exit the sleep mode, and the IC device 10 may again instruct the address pin buffer 46 to enter the sleep mode (block 122). Because the IC device 10 enters the write operation period 74, the data output buffer 42 becomes active to write the data from the IC device 10 to the communication path 14B. Further, the address pin buffer 46 is no longer used during the write operation.

Accordingly, the IC device 10 instructs the address pin buffer 46 to enter the sleep mode.

Once the data output buffer 42 exits the sleep mode, the IC device 10 performs a write transaction on the communication path 14B (block 124). As mentioned above, it may be appreciated that the communication paths 14A and 14B may also be referred to as data buses. The data output buffer 40 provides the link for transmitting data between the IC device 10 and the communication path 14B. Accordingly, the IC device 10 may write the data to the communication path 14B after the write latency period ends, and after the output buffer 42 exits the sleep mode.

Additionally, FIG. 9 is a flow chart of a method 126 for reducing power consumption by the IC device 10 during a DRAM refresh operation of the memory device 12. Initially, the IC device 10 may issue a refresh command 76, 90, or 92 (block 128). It may be appreciated that the method 126 may generally apply to both the self-refresh mode 80 and the refresh period 100.

Upon issuing the refresh command 76, 90, or 92, the IC device 10 may instruct the data input buffer 40 and the data output buffer 42 to enter sleep mode (block 130). The data input buffer 40 and the data output buffer 42 may enter the sleep mode due to none of the input/output pins operating during the course of the refresh operation. Accordingly, the data input buffer 40 and the data output buffer 42 are not used, and the buffers 40 and 42 are eligible for entering the sleep mode during the refresh operations.

Subsequently, after issuing the refresh command 76, 90, or 92, the IC device 10 may instruct the address pin buffer 46 to enter the sleep mode (block 132). Because the IC device 10 only uses the address pin while issuing and receiving commands, the address pin buffer 46 may enter the sleep mode after the commands are issued by the IC device 10. Further, the address pin buffer 46 may remain in the sleep mode for the remainder of the refresh operation.

After the address pin buffer 46 enters the sleep mode, the IC device 10 may enter the self-refresh mode 80 or the refresh period 100 (block 134). As discussed above, the self-refresh mode 80 may refer to a refresh operation during which the IC device 10 is not used by the memory device 12 for an extended period of time. The self-refresh mode 80 refreshes the memory device 12 to maintain the data on the memory device 12. Additionally, the refresh period 100 may refer to the refresh cycle that periodically maintains the data on the memory device 12 while the IC device 10 maintains normal operation.

While the IC device 10 is in the self-refresh mode 80 or the refresh period 100, the IC device 10 again instructs the address pin buffer 46 to enter the sleep mode (block 136). Because the IC device 10 only uses the address pin while issuing commands, the address pin buffer 46 may enter the sleep mode after the refresh commands are issued by the IC device 10. Further, the address pin buffer 46 may remain in the sleep mode for the remainder of the self-refresh mode 80 or the refresh period 100.

After the memory device 12 completes the self-refresh mode 80 or the refresh period 100, the IC device 10 may then instruct the address pin buffer 46 to exit the sleep mode (block 138). Upon exiting the sleep mode, the address pin buffer 46 is once again able to operate with the memory device 12. At this point, the memory device 12 may exit the refresh mode to continue normal operation, and the IC device 10 may instruct the remaining buffers to exit the sleep mode (block 140).

The methods 102, 114, and 126 provide examples of power saving techniques for the IC device 10 involving instructing buffers of the IC device 10 to enter a sleep mode. However, it may be appreciated that similar techniques may apply to other components of the IC device 10 while the other components are not used for an operation of the IC device 10. Additionally, it may be appreciated that the techniques described above may save upwards of 94% of the power consumed by the input buffer 40 or the output buffer 42 during standard buffer operation without the techniques described above.

The disclosure provided above is intended to provide various specific examples in which the IC devices 10 may reduce power consumption by controlling various power consuming components to a sleep-mode. Although the memory device 12 in this disclosure has been described in relation to DRAM devices, it should be appreciated that the memory device 12 may be an SRAM device or any other suitable memory device. However, it may be noted that an SRAM device does not use a refresh mode or a self-refresh mode. Accordingly, the IC device 10 operating with an SRAM device as the memory device 12 would not realize similar power savings as the DRAM device during the self-refresh mode 80 or the refresh period 100.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims. Moreover, means-plus-function or step-plus-function construction is not intended unless a claim recites "means for" or "step for" followed by a function. Recitations such as "configured to" are intended to define the operation of claim elements without invoking means-plus-function or step-plus-function construction.

What is claimed is:

1. A method of operating an integrated circuit device, comprising:
    issuing a command by the integrated circuit device;
    instructing buffers of input/output pins that are not used during a first operation corresponding to the command to enter a sleep mode in which the buffers of the input/output pins that are not in use are removed from a power source of the integrated circuit device, wherein removing the buffers of the input/output pins from the power source prevents the buffers from consuming power while not in actual use; and
    instructing the buffers of the input/output pins that are not used during the first operation to exit the sleep mode upon completion of the first operation.

2. The method of claim 1, comprising determining, during run time, which of the input/output pins of the integrated circuit device are not used during the first operation corresponding to the command.

3. The method of claim 2, comprising determining, during run time, the latency cost of instructing the buffers that are not used to enter and exit the sleep mode, wherein instructing the buffers to enter the sleep mode and to exit the sleep mode occurs only when the latency cost is less than a time of the integrated circuit device to perform the first operation.

4. The method of claim 1, wherein the first operation comprises a data read operation, a data write operation, a self-refresh operation, or an auto-refresh operation.

5. The method of claim 1, wherein the buffers include data input buffers, data output buffers, address pin buffers, and a clock signal output buffer.

6. The method of claim 5, comprising instructing the data input buffers, the data output buffers, and the address pin buffers to enter the sleep mode when a memory device interacting with the integrated circuit device comprises a dynamic random access memory (DRAM) device and a refresh command is issued.

7. The method of claim 1, comprising:
    when the first operation comprises a write command, instructing buffers of at least input pins of the input/output pins to enter sleep mode during the first operation; and when the first operation comprises a read command, instructing buffers of at least output pins of the input/output pins to enter sleep mode during the first operation.

8. The method of claim 1, comprising:
    determining whether to instruct the buffers of the input/output pins to enter the sleep mode based at least in part on a latency cost associated with the buffers of the input/output pins.

9. An integrated circuit device, comprising:
    two or more buffers that receive data from a memory device and write data to the memory device;
    a clock buffer that transmits a clock signal; and
    a memory controller comprising instructions to determine when each of the two or more buffers and the clock buffer are operational during an operation of the integrated circuit device, wherein the integrated circuit device controls each of the two or more buffers and the clock buffer that are non-operational to a sleep mode during the operation of the integrated circuit device in which each of the two or more buffers and the clock buffer are removed from a power source of the integrated circuit device when the two or more buffers and the clock buffer are not in use, wherein removing each of the two or more buffers and the clock buffer from the power source prevents the two or more buffers and the clock buffer from consuming power while not in actual use.

10. The integrated circuit device of claim 9, wherein the memory device comprises a dynamic random access memory (DRAM) device.

11. The integrated circuit device of claim 9, wherein the integrated circuit device issues commands, and wherein the memory controller provides instructions to control each of the two or more buffers and the clock buffer to enter or exit the sleep mode based on the commands issued by the integrated circuit device.

12. The integrated circuit device of claim 11, wherein the integrated circuit device does not control one of the two or more buffers and the clock buffer to the sleep mode when a time period of the operation is shorter than the latency cost, wherein the latency cost is a time period of the one of the two or more buffers and the clock buffer to enter and exit the sleep mode.

13. The integrated circuit device of claim 9, wherein the operation comprises a read operation, a write operation, a self-refresh operation, or an auto-refresh operation.

14. The integrated circuit device of claim 9, wherein the integrated circuit device controls each of the two or more buffers and the clock buffer that are non-operational to the sleep mode by temporarily disabling functionalities of the non-operational buffers to limit power consumed by the non-operational buffers.

15. The integrated circuit device of claim 9, wherein the integrated circuit device controls the sleep mode of each of the two or more buffers and the clock buffer based at least in part on a latency cost associated with the two or more buffers and the clock buffer.

16. A data processing system, comprising: a memory device;
- an integrated circuit device; and
- a communication path configured to communicatively couple the memory device to the integrated circuit device, wherein the memory device provides data to the integrated circuit device and receives data from the integrated circuit device; and
- wherein the integrated circuit device issues commands, performs operations associated with the commands, and instructs buffers of input/output pins of the integrated circuit device to enter a sleep mode while the buffers of the input/output pins are not in use by the integrated circuit device in which the buffers of the input/output pins that are not in use are removed from a power source of the integrated circuit device, wherein removing the buffers of the input/output pins from the power source prevents the buffers from consuming power while not in actual use.

17. The data processing system of claim 16, wherein the memory device comprises a dynamic random access memory (DRAM) device, and wherein the integrated circuit device instructs all of the buffers of the input/output pins of the integrated circuit device to enter the sleep mode during a refresh operation of the DRAM device.

18. The data processing system of claim 16, wherein the buffers of the input/output pins comprise at least an input buffer of the integrated circuit device and an address pin buffer of the integrated circuit device, and wherein at least the input buffer and the address pin buffer enter the sleep mode during a write operation.

19. The data processing system of claim 16, wherein the buffers of the input/output pins comprise at least an output buffer of the integrated circuit device and an address pin buffer of the integrated circuit device, and wherein at least the output buffer and the address pin buffer enter the sleep mode during a read operation.

20. The data processing system of claim 16, wherein the integrated circuit device instructs the buffers of the input/output pins to enter the sleep mode based at least in part on a latency cost associated with the buffers of the input/output pins entering and exiting the sleep mode.

\* \* \* \* \*